US006829179B2

(12) United States Patent
Morikawa

(10) Patent No.: US 6,829,179 B2
(45) Date of Patent: Dec. 7, 2004

(54) SEMICONDUCTOR STORAGE DEVICE HAVING SUBSTRATE POTENTIAL CONTROL

(75) Inventor: Koichi Morikawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/329,798

(22) Filed: Dec. 27, 2002

(65) Prior Publication Data

US 2003/0198089 A1 Oct. 23, 2003

(30) Foreign Application Priority Data

Apr. 16, 2002 (JP) ........................................ 2002-113242

(51) Int. Cl.[7] ................................................ G11C 7/00
(52) U.S. Cl. ............................. 365/189.09; 365/189.07; 365/54; 365/189.04; 365/185.18; 365/185.27
(58) Field of Search ........................ 365/189.09, 189.07, 365/54, 189.04, 185.18, 185.27

(56) References Cited

U.S. PATENT DOCUMENTS

| 4,667,310 A | | 5/1987 | Takada |
| 5,600,588 A | | 2/1997 | Kawashima |
| 5,740,102 A | | 4/1998 | Kawashima |
| 5,781,481 A | * | 7/1998 | Iwakiri ................... 365/189.11 |
| 5,900,665 A | * | 5/1999 | Tobita ........................ 257/357 |
| 5,986,923 A | | 11/1999 | Zhang et al. |
| 6,115,296 A | * | 9/2000 | Ando ..................... 365/189.09 |
| 6,603,345 B2 | * | 8/2003 | Takahashi ................... 327/534 |

FOREIGN PATENT DOCUMENTS

| JP | 60-127598 | 7/1985 |
| JP | 05-020865 | 1/1993 |
| JP | 07-211079 | 8/1995 |
| JP | 11-039879 | 2/1999 |
| JP | 11-086561 | 3/1999 |
| JP | 11-353880 | 12/1999 |
| JP | 2001-266576 | 9/2001 |

* cited by examiner

Primary Examiner—Connie C. Yoha
(74) Attorney, Agent, or Firm—Rabin & Berdo, P.C.

(57) ABSTRACT

A semiconductor storage device in the invention comprises a first control transistor which is connected between a bit line and a first node and whose control terminal is connected to a word line, a data retention circuit which includes a first transistor that is connected between the first node and a second reference voltage terminal, as well as a first inverter that includes a second transistor connected between a second node and the second reference voltage terminal, and a substrate potential control circuit which selectively alters a substrate potential of the first transistor so as to make a threshold voltage of the first transistor higher as compared with threshold voltages of the first control transistor and the second transistor. Thus, it is permitted to provide the semiconductor storage device of static type which realizes a reduced layout area and a lower-dissipation-power operation while ensuring the reliability and high operating speed of the write and read of data.

30 Claims, 6 Drawing Sheets

WRITING "DATA 1"

WRITING "DATA 0"

SEMICONDUCTOR STORAGE DEVICE HAVING SUBSTRATE POTENTIAL CONTROL

BACKGROUND OF THE INVENTION

The present invention relates to a static random access memory (SRAM) which is a semiconductor storage device, and more particularly to a semiconductor storage device of low power dissipation which has a high integration degree and which performs a high-speed operation.

In general, a memory cell in a prior-art SRAM is constructed of bit lines BL and BLb which pair with each other, a data retention circuit which includes a first CMOS inverter that is constituted by a first P-channel type MOS transistor (hereinbelow, termed "PMOS") connected to a first node N1 and a supply potential Vdd, as well as a first N-channel type MOS transistor (hereinbelow, termed "NMOS") connected to the first node N1 and a ground potential Vbb, and a second CMOS inverter that is constituted by a second PMOS connected to a second node N2 and the supply potential Vdd, as well as a second NMOS connected to the second node N2 and the ground potential Vbb, that is operated by receiving the output of the first CMOS inverter and that delivers its output as the input of the first CMOS inverter, and a first or second control transistor which is connected to a word line WL and which renders the path between the bit line BL or BLb and the first or second node N1 or N2 electrically conductive or nonconductive.

That is, the memory cell in the prior-art SRAM is constructed of the six MOS (Metal Oxide Semiconductor) transistors.

In the operation of writing data into such a memory cell in the prior-art SRAM, the word line WL is activated to an H level, whereby the first and second control transistors are brought into their ON states, and write data afforded to the bit lines BL and BLb beforehand are respectively written into the first node N1 and second node N2 of the data retention circuit.

In case of writing "data 1" into the first node N1, the input/output characteristics curve of the first CMOS inverter 102 and that of the second CMOS inverter 103 have a single intersection point (stable point) for a potential corresponding to the "data 1" f or example, the first supply potential (Vdd), whereas in case of writing "data 0" into the first node N1, the input/output characteristics curve of the first CMOS inverter 102 and that of the second CMOS inverter 103 have a single intersection point (stable point) for a potential corresponding to the "data 0", for example, the ground potential (VGND).

In this manner, each of the operations of writing the data into the first node N1 of the data retention circuit constructed of the two inverters is implemented in the case where both the input/output characteristics curves have the single intersection point.

Besides, during a data retention period, the first and second control transistors are held in their OFF states, and data written into the first and second nodes N1, N2 are latched in the flip-flop constructed of the first and second CMOS inverters, whereby the data are retained.

Further, in the operation of reading data out of the memory cell, the word line WL is first activated to the H level, thereby to bring the first and second control transistors into their ON states, and potentials corresponding to data held in the first node N1 and the second node N2 are respectively outputted to the bit lines BL and BLb held in their high-impedance states. Thereafter, the difference between the potentials outputted to the respective bit lines BL and BLb is amplified by a sense amplifier, whereby the data is read out.

SUMMARY OF THE INVENTION

The prior-art semiconductor storage device, however, has posed the problem that each memory cell is constructed of the six MOS transistors, so regions each serving to form the six elements are necessitated on a semiconductor substrate in accordance with the number of the memory cells which are to be arrayed in the semiconductor storage device. Especially in the prior-art semiconductor storage device, the two, first and second control transistors are required for controlling the write or read of data into or from the data retention circuit, so that regions for forming these transistors are necessitated on the semiconductor substrate. That is, the prior art has involved the problem that a layout area increases. Besides, in the prior-art semiconductor storage device, data is written or read using the two bit lines BL and BLb, so that current for the two bit lines is dissipated in the memory cell operation. This has resulted in the problem that the dissipation current in the operation increases to make lower power dissipation difficult.

In order to solve the above problems, a semiconductor storage device according to the present invention comprises a first reference voltage terminal which supplies a first potential that is a predetermined logic level; a second reference voltage terminal which supplies a second potential that is lower than the first potential, and that is a logic level different from the predetermined logic level; a first node; a first control transistor which is connected between a bit line and the first node, and whose control terminal is connected to a word line; a data retention circuit which includes a first transistor that is connected between the first node and the second reference voltage terminal, and that has its control terminal connected to a second node, and a first inverter that includes a second transistor connected between the second node and the second reference voltage terminal, having its input terminal connected to the first node, having its output terminal connected to the control terminal of the first transistor, and outputting to the output terminal a voltage correspondent to the logic level different from the logic level inputted to the input terminal; and a substrate potential control circuit which selectively alters a substrate potential of the first transistor so as to make a threshold voltage of the first transistor higher as compared with threshold voltages of the first control transistor and the second transistor.

Besides, another semiconductor storage device according to the present invention comprises a first reference voltage terminal which supplies a first potential that is a predetermined logic level; a second reference voltage terminal which supplies a second potential that is lower than the first potential, and that is a logic level different from the predetermined logic level; a first node; a first control transistor which includes a first channel region connected between a bit line and the first node, and whose control terminal is connected to a word line; and a data retention circuit which includes a first transistor that includes a second channel region connected between the first node and the second reference voltage terminal, and that has its control terminal connected to a second node, and a first inverter that includes a second transistor including a third channel region connected between the second node and the second reference voltage terminal, having its input terminal and its output terminal respectively connected to the first node and to the control terminal of the first transistor, and outputting to the output terminal a voltage correspondent to the logic level different from the logic level inputted to the input terminal; wherein an impurity concentration of the second channel region is higher as compared with impurity concentrations of the first and third channel regions.

In addition, still another semiconductor storage device according to the present invention comprises a first reference voltage terminal which supplies a first potential that is a predetermined logic level; a second reference voltage terminal which supplies a second potential that is lower than the first potential, and that is a logic level different from the predetermined logic level; a first node; a first control transistor which is connected between a first bit line and the first node, and whose control terminal is connected to a word line; a second node; a second control transistor which is connected between a second bit line and the second node, and whose control terminal is connected to the word line; a data retention circuit which includes a first inverter that includes a first transistor connected between the first node and the second reference voltage terminal, and having a first control terminal connected to the second node, and that outputs to the first node a voltage correspondent to the logic level different from the logic level inputted to the second node, and a second inverter that includes a second transistor connected between the second node and the second reference voltage terminal, and having a second control terminal connected to the first node, and that outputs to the second node a voltage correspondent to the logic level different from the logic level inputted to the first node; wherein a threshold voltage of the first transistor in case of writing data into the first node is higher as compared with threshold voltages of the first control transistor and the second transistor.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Now, the first embodiment of the invention will be described in detail with reference to the drawings.

Figure 1:
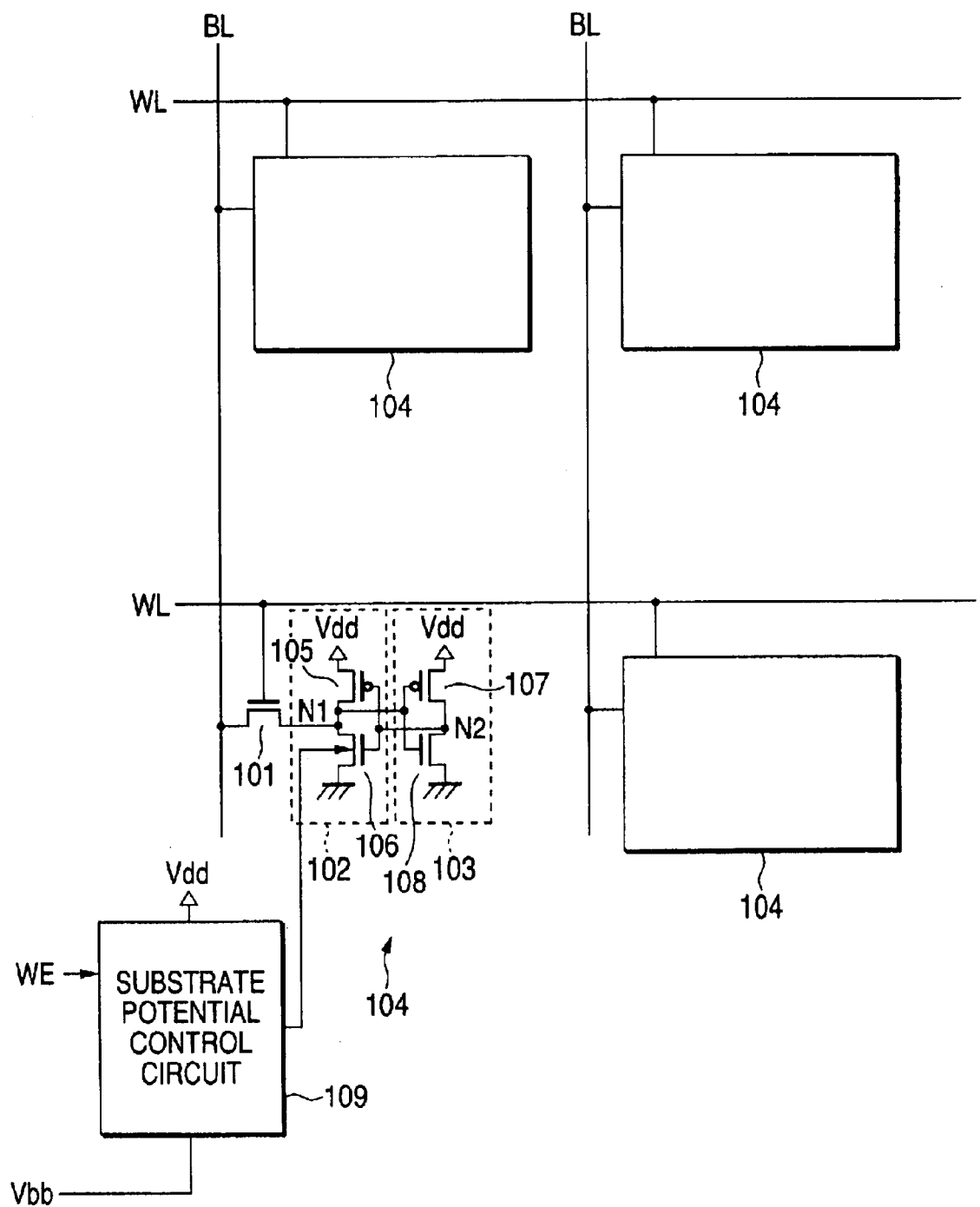
FIG. 1 is a circuit diagram showing a semiconductor storage device in a first embodiment of the invention.
Figure 2:
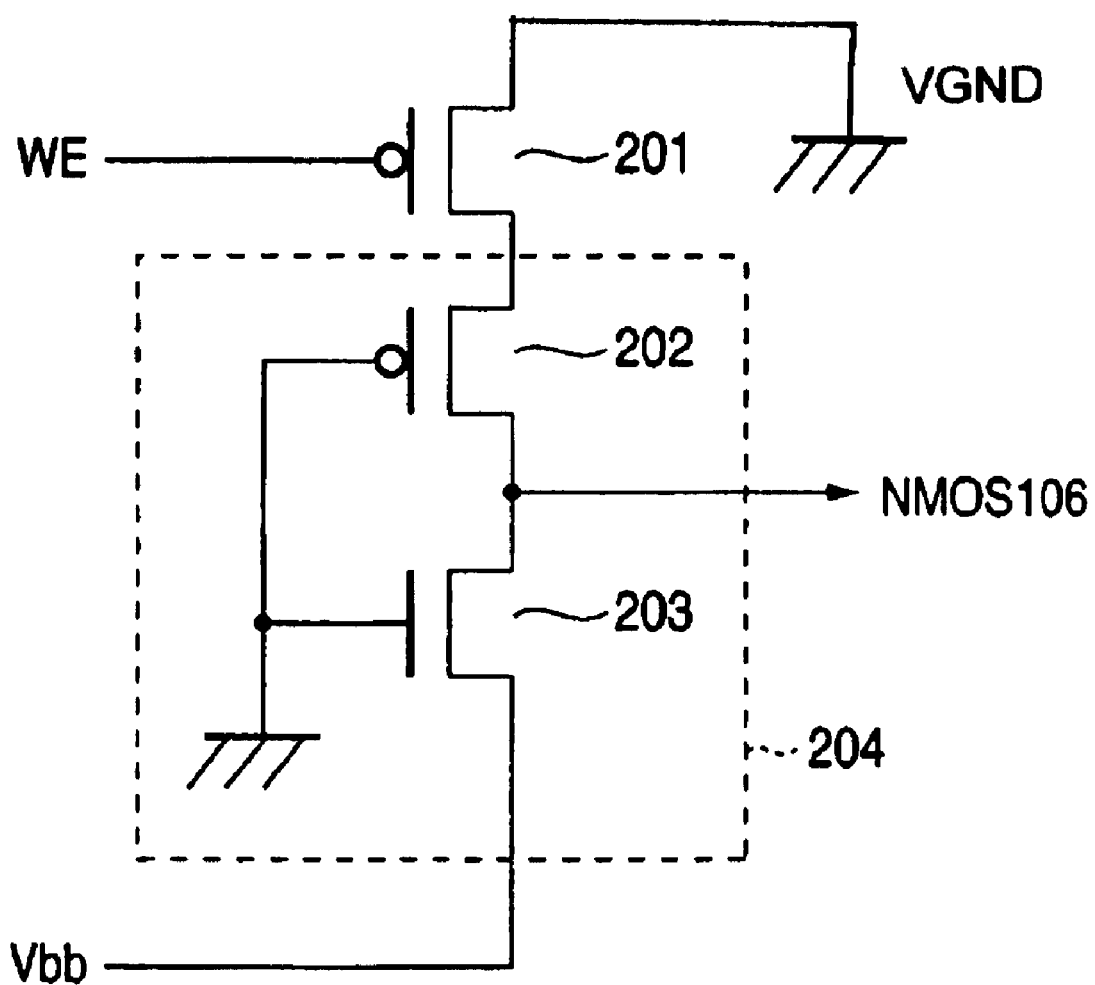
FIG. 2 is a circuit diagram showing a practicable example of a substrate potential control circuit in the first embodiment of the invention.

FIG. 1 is a diagram showing a semiconductor storage device in the first embodiment of the invention, while FIG. 2 is a diagram showing a practicable example of a substrate potential control circuit in this embodiment.

The semiconductor storage device in this embodiment is constructed of pluralities of bit lines and word lines, and a plurality of memory cells which are connected to the intersection points between the bit lines and the word lines. One of the memory cells is concretely shown in FIG. 1.

As shown in FIG. 1, the semiconductor storage device in this embodiment is constructed of each bit line BL, each word line WL, and each memory cell which is connected to the intersection point between the bit line BL and the word line WL. The memory cell in this embodiment is connected to the intersection point between the bit line BL and the word line WL, and constructed of a first control transistor 101 of N-channel type transistor which is operated by a row address signal from the word line WL, a first node N1 which is connected to the drain electrode of the first control transistor 101, and a data retention circuit 104 which includes a first inverter 102 that delivers a first inverter output to the first node N1, and a second inverter 103 that receives the first inverter output as its input and that delivers its output (second inverter output) as the input of the first inverter 102.

The first inverter 102 in this embodiment is a CMOS inverter which is constructed of a first PMOS transistor 105 (fourth transistor) that is connected between the first node N1 and a first supply potential (Vdd) correspondent to a first potential being a predetermined logic level, for example, 0.5 V, and a first NMOS transistor 106 (first transistor) that is connected between the first node N1 and a ground potential (VGND) of a second supply potential correspondent to a second potential being lower than the first potential and being a logic level different from the predetermined logic level of the first potential, and that is operated by a threshold voltage higher than the threshold voltages of the first control transistor 101 and a second NMOS transistor 108 (second transistor).

On the other hand, the second inverter 103 is a CMOS inverter which includes a second node N2 for delivering the second inverter output, and which is constructed of a second PMOS transistor 107 (third transistor) connected between the first supply potential (Vdd) and the second node N2, and the second NMOS transistor 108 (second transistor) connected between the second node N2 and the ground potential (VGND).

That is, the semiconductor storage device of this embodiment has a single-end structure which is constructed of the five transistors connected to each bit line BL.

Further, in the semiconductor storage device in this embodiment, a substrate potential control circuit 109 for controlling a substrate potential to be applied to the substrate of the first NMOS transistor 106 is disposed in connection to the substrate of the first NMOS transistor 106 in order to make the threshold voltage of the first NMOS transistor 106 higher than the threshold voltages of the first control transistor 101 and second NMOS transistor 108.

One circuit arrangement example which realizes the substrate potential control circuit 109 in this embodiment is as shown in FIG. 2. More specifically, the exemplary control circuit 109 is constructed of a PMOS transistor 201 whose source electrode is connected to the ground potential (VGND) and whose gate electrode is fed with a write control signal WE for controlling the write of data into the data retention circuit 104, and a third CMOS inverter 204 which includes a PMOS transistor 202 that has its source electrode connected to the drain electrode of the PMOS transistor 201 and that has the ground potential (VGND) applied to its gate electrode, and an NMOS transistor 203 that has its drain electrode connected to the drain electrode of the PMOS transistor 202, that has a third supply potential (Vbb) lower than the ground potential (VGND) applied to its source electrode and that has the same ground potential (VGND) as in the PMOS transistor 202 applied to its gate electrode. Besides, the inverter output (third inverter output) of the third CMOS inverter 204 is applied to the substrate of the first NMOS transistor 106.

Regarding the third supply potential (Vbb) lower than the ground potential (VGND) as is applied to the substrate potential control circuit 109, it is possible to properly select such a degree of voltage that the threshold voltage of the first NMOS transistor 106 becomes higher than the threshold voltages of the first control transistor 101 and the second NMOS transistor 108.

According to the semiconductor storage device in this embodiment in which, as described above, the substrate potential control circuit 109 is disposed in connection with the substrate of the desired transistor constituting the data retention circuit 104, the substrate potential control circuit 109 is operated in writing data into the memory cell, whereby the threshold voltage of the first NMOS transistor 106 can be made higher than those of the first control transistor 101 and second NMOS transistor 108 in writing the data into the first node N1. As a result, the input/output characteristics of the first inverter are shifted, and the data writing in the SRAM of single-end type can be implemented.

Now, the operations of the semiconductor storage device in this embodiment including the substrate potential control circuit 109 will be described in detail.

(1) Read Operation

In the read operation of the semiconductor storage device in this embodiment, the word line WL is first activated by a row address signal for selecting the memory cell from which data is to be read out. Thereafter, the first control transistor 101 which is connected between the bit line BL and the data retention circuit 104 is brought into its ON state by the activated word line WL, whereby a data signal retained in the data retention circuit 104, namely, the potential of the first inverter output delivered to the first node N1 is applied to the bit line BL through the first control transistor 101. Besides, the potential of the bit line BL on this occasion is amplified by a sense amplifier circuit connected to the bit line BL, and the amplified potential is read out as an output signal.

In the substrate potential control circuit 109 during the read operation, the third supply potential (Vbb) of, for example, about –0.5 V as is lower than the ground potential is connected to the source electrode of the NMOS transistor 203, and the write control signal WE of "L" level is inputted to the gate electrode of the PMOS transistor 201.

That is, during the read operation in the semiconductor storage device of this embodiment, among the transistors which constitute the substrate potential control circuit 109, the PMOS transistor 201 connected to the ground potential falls into its ON state, so that the ground potential (VGND) is outputted to the substrate of the first NMOS transistor 106 to which the substrate potential control circuit 109 is connected.

(2) Write Operation

Next, the write operation of the semiconductor storage device in this embodiment will be described with reference to FIG. 1 and FIGS. 3A and 3B.

Figure 3A:
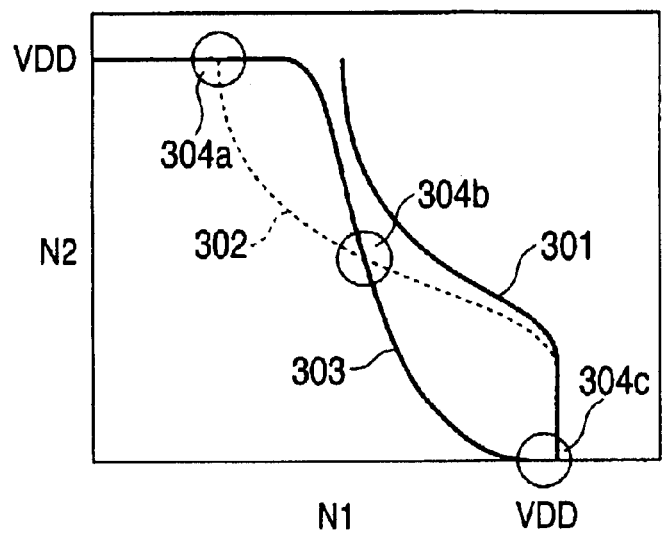
FIGS. 3A and 3B are graphs each showing the input/output characteristics of individual inverters which are included in the semiconductor storage device in the first embodiment of the invention.
Figure 3B:
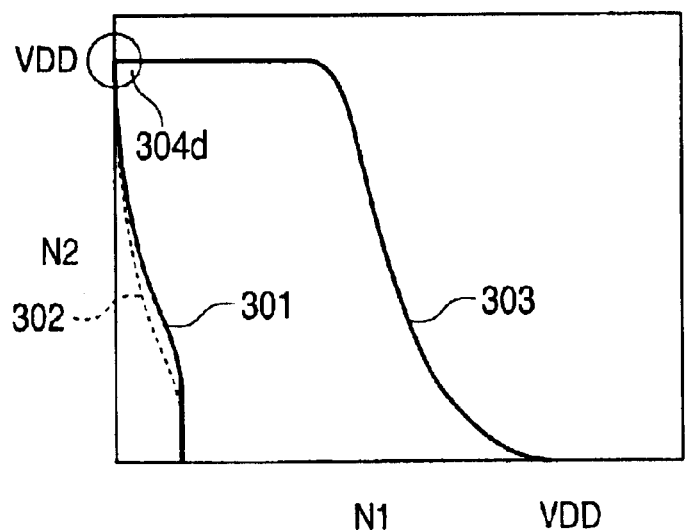

Here, FIGS. 3A and 3B are graphs each showing the input/output characteristics of the inverters 102 and 103 which constitute the data retention circuit 104 in this embodiment. The graph of FIG. 3A shows the input/output characteristics of the inverters 102 and 103 in the case where "data 1" being first data is written into the first node N1, while the graph of FIG. 3B shows the input/output characteristics of the inverters 102 and 103 in the case where "data 0" being second data is written into the first node N1.

In the graph of each of FIGS. 3A and 3B, the axis of abscissas represents a potential appearing at the first node N1, and the axis of ordinates represents a potential appearing at the second node N2.

(a) Mode of "Data 1" Write Operation

In case of writing the "data 1" into the first node N1, first of all, the third supply potential (Vbb) lower than the ground potential (VGND) is connected to the source electrode of the NMOS transistor 203 of the substrate potential control circuit 109, and the write control signal WE of "H" level is inputted to the gate electrode of the PMOS transistor 201.

In the mode of the "data 1" write operation in the semiconductor storage device of this embodiment, among the transistors constituting the substrate potential control circuit 109, the PMOS transistor 201 connected to the ground potential (VGND) falls into its OFF state, and only the NMOS transistor 203 falls into its ON state. Thus, the third supply potential (Vbb) lower than the ground potential (VGND) as is connected to the NMOS transistor 203 is applied to the substrate of the first NMOS transistor 106 to which the substrate potential control circuit 109 is connected.

When the third supply potential (Vbb) lower than the ground potential. (VGND) is applied to the substrate of the first NMOS transistor 106 through the substrate potential control circuit 109 in this manner, the threshold voltage of this first NMOS transistor 106 becomes higher as compared with that of the NMOS transistor whose substrate potential is not controlled and to which the ground potential (VGND) is applied as its substrate potential.

More specifically, according to the semiconductor storage device in this embodiment, as shown in FIG. 3A, the first NMOS transistor 106 controlled to the higher threshold voltage is used as one transistor constituting the first inverter 102, whereby the input/output characteristics curve 301 of the first CMOS inverter 102 including the first NMOS transistor 106 is shifted onto the side of the "data 1" as compared with the inverter input/output characteristics curve 302 based on the NMOS transistor to which the ground potential (VGND) is applied as the substrate potential.

In such a case, when a potential corresponding to the "data 0" is applied to the first node N1 beforehand, and a potential corresponding to the "data 1" is applied to the bit line BL, a signal corresponding to the "data 1" is inputted to the first node N1 through the first control transistor 101. Thereafter, the second CMOS inverter 103 operates in response to the signal inputted to the first node N1, and the data of the second node N2 is rewritten. On this occasion, the first NMOS transistor 106 having the higher threshold voltage is held in its OFF state, so that the output (first inverter output) of the first CMOS inverter 102 is prevented from lowering to the ground potential (VGND).

When the potential is prevented from lowering to the ground potential (VGND) at the first node N1, this potential of the first node N1 is maintained, with the result that the potential of the second node N2 lowers. In a case where the potential of the second node N2 has exceeded the threshold voltage of the first NMOS transistor 106, the first CMOS inverter 102 operates to write the "data 1" into the first node N1.

In the prior-art semiconductor storage device of single-end type including the inverter that employs the first NMOS transistor 106 whose substrate potential is not controlled and to which the ground potential (VGND) is applied as the substrate potential, in case of writing the "data 1" into the first node N1, three stable points 304a–304c exist as the intersection points between the input/output characteristics curve 302 of the first inverter 102 and the input/output characteristics curve 303 of the second inverter 103 for a substrate voltage GND as shown in FIG. 3A. That is, in the prior-art semiconductor storage device of single-end type, the "data 1" cannot be written into the first node N1 at which the "data 0" is held beforehand.

In contrast, according to the semiconductor storage device of single-end type in this embodiment, the threshold voltage of the first NMOS transistor 106 which is one transistor constituting the first inverter 102 is heightened by disposing the substrate potential control circuit 109, whereby the input/output characteristics curve 301 of the first inverter 102 including the first NMOS transistor 106 is shifted onto the "data 1" side as shown in FIG. 3A. According to the semiconductor storage device in this embodiment, consequently, the stable point 304c necessary for writing the "data 1" is left behind, and the other two stable points 304a and 304b are erased. It is therefore permitted to write the "data 1" into the first node N1.

Especially, in the semiconductor storage device of this embodiment, the substrate potential control circuit 109 for controlling the substrate potential of the first NMOS transistor 106 should desirably be so constructed that the threshold voltage of the first NMOS transistor 106 becomes, at least, about 2.7 times as high as the threshold voltage of the first control transistor 101 for controlling the data write operation.

(b) Mode of "Data 0" Write Operation

In case of writing the "data 0" into the first node N1, first of all, the write control signal WE of "H" level is inputted to the gate electrode of the PMOS transistor 201 of the substrate potential control circuit 109 in the same manner as in the "data 1" write operation described above.

On this occasion, the third supply potential (Vbb) lower than the ground potential (VGND) is connected to the drain electrode of the NMOS transistor 203.

As stated before, in the operation of writing the "data 0", into the semiconductor storage device in this embodiment, among the transistors constituting the substrate potential control circuit 109, the two transistors of the PMOS transistor 201 connected to the ground potential (VGND) and the PMOS transistor 202 connected to the PMOS transistor 201 fall into their OFF states, and the NMOS transistor 203 falls into its ON state. That is, the third supply potential (Vbb) lower than the ground potential (VGND) is applied to the substrate of the first NMOS transistor 106 to which the substrate potential control circuit 106 is connected.

As a result, the threshold voltage of the first NMOS transistor 106 in which the third supply potential (Vbb) lower than the ground potential (VGND) is applied to its substrate becomes higher as compared with that of the NMOS transistor in which the ground potential (VGND) is applied to its substrate.

The first NMOS transistor 106 controlled to the higher threshold voltage is used as one transistor in the first inverter 102 constituting the data retention circuit 104, whereby the input/output characteristics curve 301 of the first inverter 102 including the first NMOS transistor 106 is shifted onto the side of the "data 1" as compared with the input/output characteristics curve 302 of the CMOS inverter including the NMOS transistor to which the ground potential (VGND) is applied as the substrate potential, while a stable point 304d necessary for the "data 0" write operation is kept.

However, the shift magnitude of the input/output characteristics curve in the "data 0" write operation is smaller as compared with the shift magnitude in the "data 1", write operation described before.

In such a case, when a potential corresponding to the "data 0" is applied to the bit line BL, a signal corresponding to the "data 0" is inputted to the first node N1 through the first control transistor 101. Thereafter, the second inverter 103 operates in response to the signal inputted to the first node N1 being an input terminal, and the data of the second node N2 is rewritten. On this occasion, as in the foregoing "data 1" write operation, the first NMOS transistor 106 having the higher threshold voltage is held in its OFF state, so that the output (first inverter output) of the first inverter 102 is prevented from lowering to the ground potential (VGND).

When the potential is prevented from lowering to the ground potential (VGND) at the first node N1, this potential of the first node N1 is maintained, with the result that the potential of the second node N2 lowers. In a case where the potential of the second node N2 has exceeded the threshold voltage of the first NMOS transistor 106, the first inverter 102 operates to write the "data 0" into the first node N1.

In this embodiment, the substrate potential control circuit 109 has been described by exemplifying the circuit arrangement shown in FIG. 2. A substrate potential control circuit of any other known circuit arrangement such as level conversion circuit, however, is also applicable as long as it applies to the first NMOS transistor 106 the substrate potential which makes the threshold voltage of this first NMOS transistor 106 higher as compared with the threshold voltages of the first control transistor 101 for controlling the data write operation, and the second NMOS transistor 108.

Besides, as shown in FIG. 3B, in the case of writing the "data 0" into the first node N1 in the semiconductor storage device of this embodiment, only one stable point 304d exists even if the substrate potential control circuit 109 does not operate. Therefore, the substrate potential control circuit 109 may operate in, at least, the mode of writing the "data 1" into the first node N1.

Further, in the semiconductor storage device of this embodiment, the substrate potentials of the first control transistor 101 and the second NMOS transistor 108 should desirably be set substantially equal to each other, and the threshold voltages of these transistors 101 and 108 should desirably be held substantially equal to each other.

As described above, according to the semiconductor storage device in this embodiment, the substrate potential control circuit 109 is connected to the substrate of the first NMOS transistor 106 which is interposed between the first node N1 and the ground potential (VGND). It is therefore permitted to remove the second control transistor connected to the second node N2, and another bit line BLb connected through the second control transistor, the second control transistor and the bit line BLb being indispensable to the prior-art memory cell.

As a result, in the semiconductor storage device of this embodiment, the memory cell which has heretofore been constructed of the six elements and the two bit lines can be constructed of the five elements and the single bit line. It is therefore permitted to enhance an integration degree and to enhance yield.

Besides, since the number of the bit lines for the memory cells becomes smaller than in the prior art, a sufficient interval is ensured between the adjacent wiring lines of the bit lines, and current which is dissipated during the memory operation is suppressed. Thus, it is permitted to provide the semiconductor storage device which operates with lower dissipation power.

In addition, according to the semiconductor storage device of this embodiment in which the substrate potential control circuit 109 is disposed so as to apply the desired substrate potential to the first NMOS transistor 106, in writing data into the first node N1 connected to the bit line BL, the "data 1" and the "data 0" are written into the first node N1 by applying, for example, the desired third supply potential (Vbb) lower than the ground potential (VGND) to the substrate of the first NMOS transistor 106 through the substrate potential control circuit 109 as the substrate potential, and also in reading data, the data is read out by applying the ground potential (VGND) to the substrate of the first NMOS transistor 106 through the substrate potential control circuit 109 as the substrate potential.

According to this embodiment thus constructed, the threshold voltage of the first NMOS transistor 106 can be controlled in both the data write operation in which the lowering of the potential to the ground potential (VGND) needs to be suppressed at the first node N1, and the data read operation in which the potential needs to be quickly lowered to the ground potential (VGND) at the first node N1. It is consequently permitted to provide the single-end type semiconductor storage device which achieves the data write operation and simultaneously achieves the read operation at high speed.

Besides, this embodiment has been described by exemplifying the single-port type SRAM shown in FIG. 1 as can perform only one read operation by one time of operation.

Figure 4:
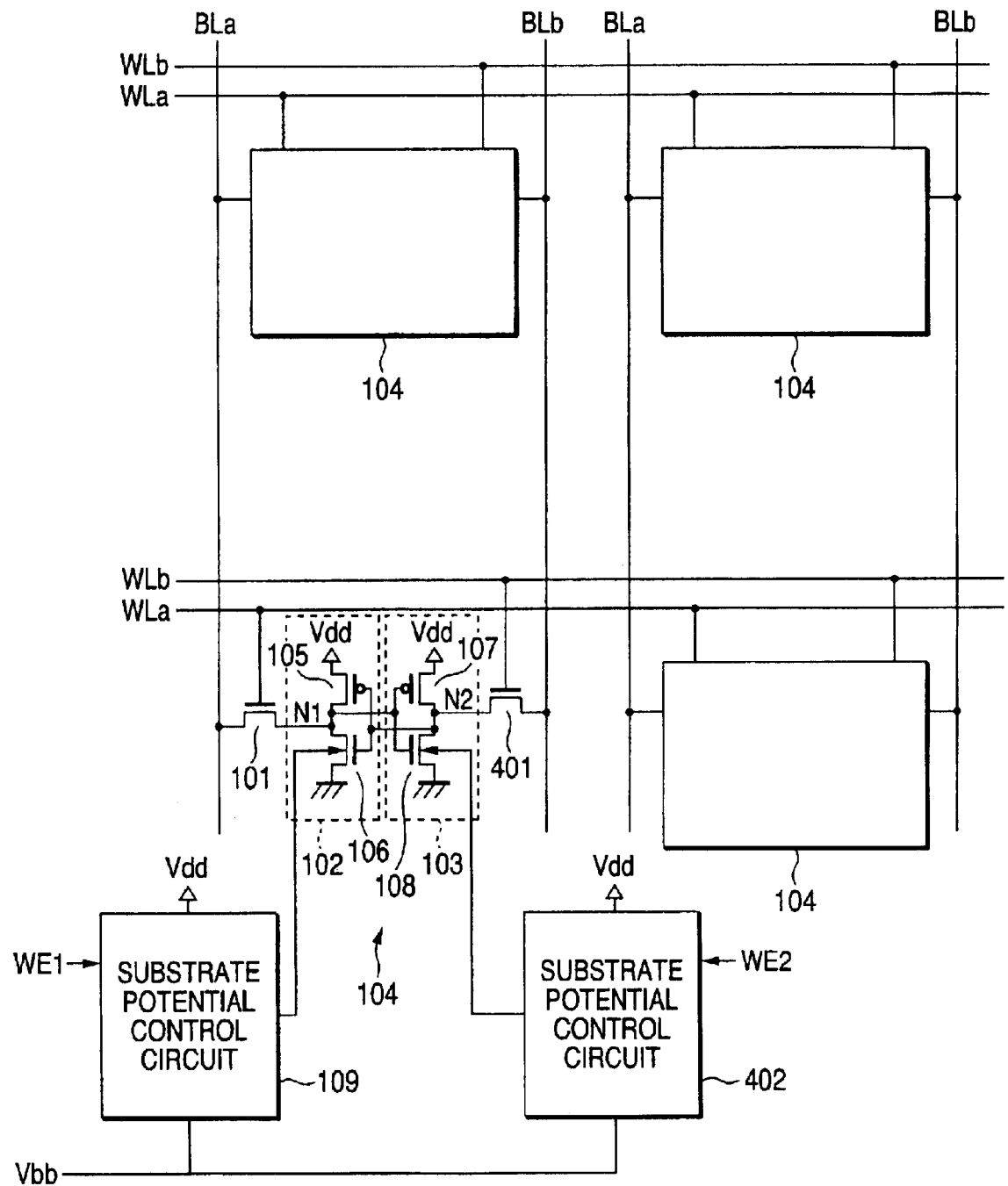
FIG. 4 is a circuit diagram showing another semiconductor storage device in the first embodiment.

However, the semiconductor storage device in this embodiment is not restricted to the single-port type SRAM, but it is also applicable to a dual-port type SRAM in which, as shown in FIG. 4, a second bit line BLb and a second word line WLb are laid in addition to a bit line BLa and a word line WLa that are used in the single-port type SRAM in FIG. 1, a second control transistor 401 is connected between the second bit line BLb and a second node N2 so as to be controlled by a signal from the second word line WLb, and a second substrate potential control circuit 402 is connected to the substrate of the second NMOS transistor 108 so as to be controlled by a write control signal WE2 for controlling the write of data into the second node N2.

The second bit line BLb, second word line WLb and second control transistor 401 in the dual-port type SRAM are constructed similarly to the corresponding portions of the single-port type SRAM. Besides, the second substrate potential control circuit 402 is realized by substantially the same circuit arrangement as shown in FIG. 2. The second substrate potential control circuit 402 is the same as the first substrate potential control circuit 109 except the points that the second write control signal WE2 is inputted to the gate electrode of the PMOS transistor 201 connected to the ground potential (VGND), and that, in writing data into the second node N2, the control circuit 402 feeds the substrate of the second NMOS transistor 108 with a potential which makes the threshold voltage of the second NMOS transistor 108 higher than the threshold voltages of the second control transistor 401 and the first NMOS transistor 106.

Besides, data are written into and read out of the first node N1 and second node N2 of the dual-port type SRAM by the same operations as the write and read of data in the single-port type SRAM described before.

In this manner, according to this embodiment, it is permitted to provide the dual-port type SRAM in which two simultaneous read operations can be implemented by the six elements of the two control transistors, and the data retention circuit consisting of the four transistors. As compared with a dual-port type SRAM in the prior art, therefore, this embodiment permits to enhance an integration degree and yield. Moreover, this embodiment permits to provide the semiconductor storage device which operates with lower dissipation power while keeping the high-speed operation.

Besides, in the dual-port type SRAM as shown in FIG. 4, in case of writing data into the first node N1, the substrate potentials of the first control transistor 101 and the second NMOS transistor 108 should desirably be held substantially equal to each other, and the threshold voltages of these transistors 101 and 108 should desirably be set substantially equal to each other.

Further, in case of writing data into the second node N2, the substrate potentials of the second control transistor 401 and the first NMOS transistor 106 should desirably be held substantially equal to each other, and the threshold voltages of these transistors 401 and 106 should desirably be set substantially equal to each other.

The semiconductor storage device in the first embodiment may be a conventional one in which the elements are formed in the surface of a silicon substrate, or may well be one in which the elements are formed in the silicon layer of an SOI (Silicon On Insulator) substrate having an insulating layer provided therein.

Next, the second embodiment of the invention will be described.

Figure 5:
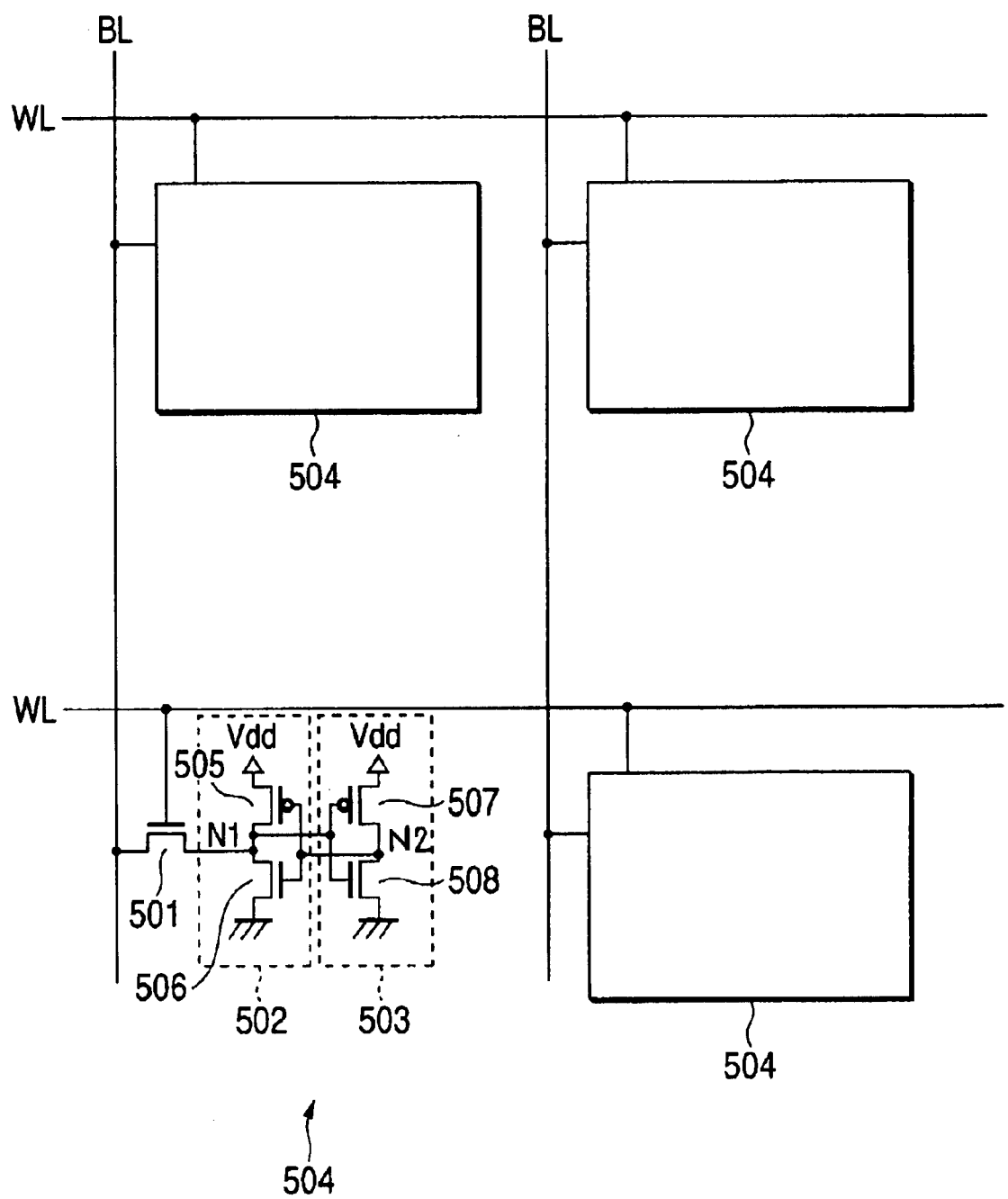
FIG. 5 is a circuit diagram showing a semiconductor storage device in a second embodiment of the invention.

FIG. 5 shows a semiconductor storage device in the second embodiment. Besides, the same reference numerals and signs as indicated in the first embodiment designate identical or corresponding portions, and one of memory cells is specifically shown in FIG. 5.

As in the first embodiment described before, the semiconductor storage device of the second embodiment is constructed of each bit line BL, each word line WL, and each memory cell which is connected to the intersection point between the bit line BL and the word line WL. The memory cell in this embodiment is connected to the intersection point between the bit line BL and the word line WL, and is constructed of a first control transistor 501 of N-channel type which includes a source region connected to the bit line BL, a drain region connected to a first node N1 and a channel region formed between the source and drain regions, and which is operated by a row address signal from the word line WL, and a data retention circuit 504 which includes a first inverter 502 that delivers a first inverter output to the first node N1, and a second inverter 503 that receives the first inverter output as its input signal and that delivers its output (second inverter output) as the input signal of the first inverter 502.

The first inverter 502 in this embodiment is a CMOS inverter which includes a first PMOS transistor 505 (fourth transistor) that is connected between a first supply potential (Vdd) and the first node N1, and a first NMOS transistor 506 (first transistor) that is connected between the first node N1 and a ground potential (VGND) being a second supply potential through a first channel region and that is operated by a threshold voltage higher than the threshold voltage of the first control transistor 501.

On the other hand, the second inverter 503 is a CMOS inverter which includes a second node N2 that delivers the second inverter output, a second PMOS transistor 507 (third transistor) that is connected between the first supply potential (Vdd) and the second node N2, and a second NMOS transistor 508 (second transistor) that is connected between the second node N2 and the ground potential (VGND) through a second channel region.

That is, also the semiconductor storage device of this embodiment has a single-end type structure which is constructed of the five transistors connected to one bit line BL.

In the semiconductor storage device of the first embodiment described before, in order to ensure the single stable point which is indispensable in the write of data, the substrate potential control circuit 109 which controls the substrate potential of the first NMOS transistor 106 is disposed, and the threshold voltage of the first NMOS transistor 106 is heightened, whereby the input/output characteristics curve of the first inverter 102 is shifted while the potential is prevented from lowering at the first node N1.

In contrast, in the semiconductor storage device of the second embodiment, the transistors having substantially the same sizes are employed, and the impurity concentration of the first channel region in the first NMOS transistor 506 is set higher than the impurity concentrations of the channel regions in the first control transistor 501 and second NMOS transistor 508, whereby the threshold voltage of the first NMOS transistor 506 is made higher than the threshold voltages of the first control transistor 501 and second transistor 508.

On this occasion, the threshold voltage of the first NMOS transistor 506 should desirably be set, at least, about 2.7 times as high as the threshold voltage of the first control transistor 501, and the impurity concentrations of the first NMOS transistor 506 and first control transistor 501 are properly determined so as to establish this condition.

Besides, in the second embodiment, the threshold voltages of the first control transistor 501 and second NMOS transistor 508 should desirably be substantially equal to each other, and the impurity concentration of the channel region of the first control transistor 501 and that of the second channel region of the second NMOS transistor 508 should desirably be set substantially equal to each other.

Thus, also in the semiconductor storage device of the second embodiment, the input/output characteristics curve of the first inverter 502 including the first NMOS transistor 506 is shifted onto the side of "data 1", so that unnecessary stable points (for example, 304a and 304b in FIG. 3A) are removed while the single stable point (for example, 304c in FIG. 3A) indispensable in the write of data is ensured. That is, the single-end type semiconductor storage device capable of writing the "data 1" and "data 0" is provided.

Now, the operations of the semiconductor storage device in the second embodiment will be described.

(1) Read Operation

In the read operation of the semiconductor storage device in this embodiment, the word line WL is first activated by a row address signal for selecting the memory cell from which data is to be read out. Thereafter, the first control transistor 501 which is connected between the bit line BL and the data retention circuit 504 is brought into its ON state by the activated word line WL, whereby a data signal retained in the data retention circuit 504, namely, the potential of the first inverter output delivered to the first node N1 is applied to the bit line BL through the first control transistor 501. Besides, the potential of the bit line BL on this occasion is amplified by a sense amplifier circuit connected to the bit line BL, and the amplified potential is read out as an output signal.

(2) Write Operation

In case of writing data ("data 1" or "data 0") into the first node N1, the threshold voltage of the first NMOS transistor 506 in this embodiment is higher as compared with those of the NMOS transistors (first control transistor 501 and second NMOS transistor 508) whose threshold voltages are not controlled.

Especially in this embodiment, the impurity concentrations should desirably be determined so that the threshold voltage of the first NMOS transistor 506 may become, at least, about 2.7 times as high as the threshold voltage of the first control transistor 501.

That is, also in the semiconductor storage device of this embodiment, the input/output characteristics curve of the first inverter 502 including the first NMOS transistor 506 is shifted onto the side of "data 1".

In such a case, when a potential corresponding to the "data 0" is applied to the first node N1 beforehand, and a potential corresponding to the "data 1" is applied to the bit line BL, a signal corresponding to the "data 1" is inputted to the first node N1 through the first control transistor 501. Thereafter, the second inverter 503 operates in response to the signal inputted to the first node N1, and the data of the second node N2 is rewritten. On this occasion, the first NMOS transistor 506 having the higher threshold voltage is held in its OFF state, so that the output (first inverter output) of the first inverter 502 is prevented from lowering to the ground potential (VGND).

When the potential is prevented from lowering to the ground potential (VGND) at the first node N1, this potential of the first node N1 is maintained, with the result that the potential of the second node N2 lowers. In a case where the potential of the second node N2 has exceeded the threshold voltage of the first NMOS transistor 506, the first inverter 502 operates to write the "data 1" into the first node N1.

Figure 6:
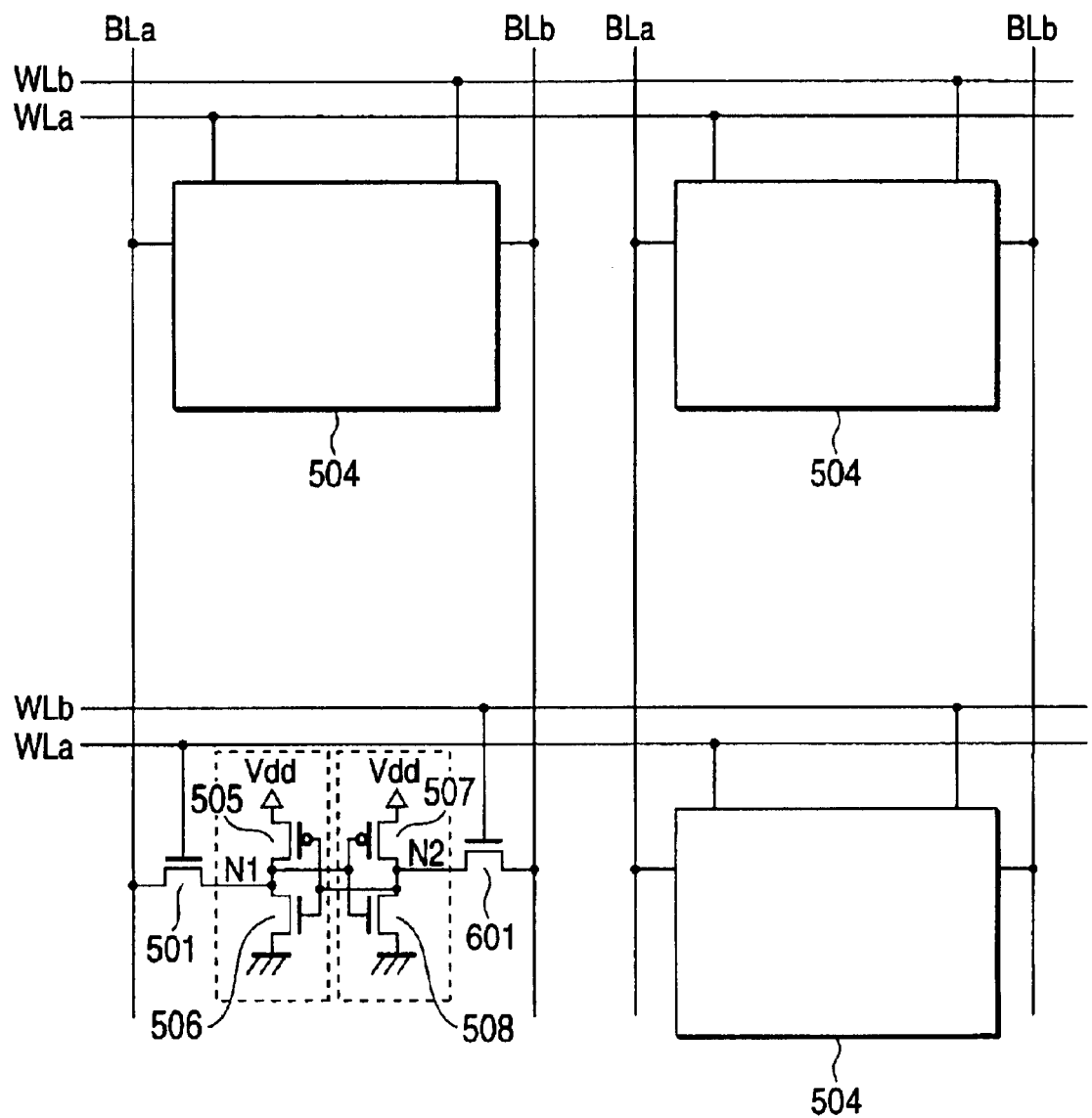
FIG. 6 is a circuit diagram showing another semiconductor storage device in the second embodiment.

Besides, as in the first embodiment described before, the semiconductor storage device in the second embodiment is not restricted to the single-port type SRAM, but it is also applicable to a dual-port type SRAM in which, as shown in FIG. 6, a second bit line BLb and a second word line WLb are laid in addition to a bit line BLa and a word line WLa that are used in the single-port type SRAM in FIG. 5, and a second control transistor 601 is connected between the second bit line BLb and a second node N2 so as to be controlled by a signal from the second word line WLb. In case of the dual-port type of the second embodiment, however, data is written into the first node N1, and data are read out of the first node N1 and the second node N2.

The second bit line BLb and second word line WLb in the dual-port type SRAM are constructed similarly to the corresponding portions of the single-port type SRAM. The second control transistor 601 is an N-channel type transistor which has a threshold voltage higher than the threshold voltages of the first control transistor 501 and the second NMOS transistor 508.

Besides, the data is written into the first node N1 in the dual-port type SRAM, and the data are read out of the first node N1 and second node N2, by the same operations as the write and read of data in the single-port type SRAM described before.

In this manner, according to this embodiment, it is permitted to provide the dual-port type SRAM in which two simultaneous read operations can be implemented by the six elements of the two control transistors, and the data retention circuit consisting of the four transistors. As compared with the dual-port type SRAM in the prior art, therefore, this embodiment permits to enhance an integration degree and yield. Moreover, since the number of bit lines is decreased, it is permitted to provide the semiconductor storage device which operates with lower dissipation power.

In this embodiment, the threshold voltages of the transistors are changed by the differences of impurity concentrations in the transistors so as to control the drivabilities of the transistors. Therefore, the individual transistors can be formed having the smallest element sizes, with the result that the occupation area of each memory cell in the semiconductor storage device can be made small.

As described above, according to the semiconductor storage device in the second embodiment, the impurity concentrations of the individual transistors are set so that the threshold voltage of the first NMOS transistor 506 interposed between the first node N1 and the ground potential (VGND) may become higher as compared with the threshold voltages of the first control transistor 501 and the second NMOS transistor 508. Thus, it is permitted to remove the second control transistor connected to the second node N2, and the other bit line BLb connected through the second control transistor, the second control transistor and the bit line BLb being indispensable to the prior-art memory cell.

As a result, in the semiconductor storage device of this embodiment, the memory cell which has heretofore been constructed of the six elements and the two bit lines can be constructed of the five elements and the single bit line. It is therefore permitted to enhance an integration degree and yield.

Besides, since the number of the bit lines for the memory cells becomes smaller than in the prior art, a sufficient interval is ensured between the adjacent wiring lines of the bit lines, and current which is dissipated during the memory operation is suppressed. Thus, it is permitted to provide the semiconductor storage device which operates with lower dissipation power.

Further, in the semiconductor storage device of this embodiment, the drivabilities of the individual transistors constituting the single-end type semiconductor storage device are not controlled by changing the sizes of the elements, but the threshold voltages of the transistors are controlled by properly changing the impurity concentrations of the channel regions of these transistors. Therefore, the sizes of the individual elements constituting each memory cell can be made constant, and the layout of the cells need not be altered. As a result, the single-end type semiconductor storage device can be provided with a shorter TAT as compared with a single-end type semiconductor storage device which implements the write of "data 1" by, for example, changing the element sizes of individual transistors.

Besides, in case of the dual-port type SRAM as shown in FIG. 6, the threshold voltages of the first control transistor 501 and second NMOS transistor 508 should desirably be substantially equal to each other, and the impurity concentrations of the channel region of the first control transistor 501 and the second channel region of the second NMOS transistor 508 should desirably be set substantially equal to each other. Further, the threshold voltages of the second control transistor 601 and first NMOS transistor 506 should desirably be substantially equal to each other, and the impurity concentrations of the channel region of the second control transistor 601 and the first channel region of the first NMOS transistor 506 should desirably be set substantially equal to each other.

Also the semiconductor storage device in the second embodiment may be a conventional one in which the elements are formed in the surface of a silicon substrate, or may well be one in which the elements are formed in the silicon layer of an SOI (Silicon On Insulator) substrate having an insulating layer formed therein.

As described above, according to a semiconductor storage device in the invention, the threshold voltage of a first NMOS transistor interposed between a first node N1 and a ground potential (VGND) is set higher as compared with the threshold voltages of a first control transistor and a second NMOS transistor, whereby each memory cell which has heretofore been constructed of six elements and two bit lines can be constructed of five elements and one bit line. As a result, an integration degree and yield can be enhanced, and a dissipation current in a memory operation is lowered.

What is claimed is:

1. A semiconductor storage device comprising:
   a first reference voltage terminal which supplies a first potential that is a predetermined logic level;
   a second reference voltage terminal which supplies a second potential that is lower than the first potential, and that is a logic level different from the predetermined logic level;
   a first node;
   a first control transistor which is connected between a bit line and said first node, and whose control terminal is connected to a word line;
   a data retention circuit which includes a first transistor that is connected between said first node and said second reference voltage terminal, and that has its control terminal connected to a second node, and a first inverter that includes a second transistor connected between said second node and said second reference voltage terminal, having its input terminal connected to said first node, having its output terminal connected to the control terminal of said first transistor, and outputting to said output terminal a voltage correspondent to the logic level different from the logic level inputted to said input terminal; and
   a substrate potential control circuit which selectively alters a substrate potential of said first transistor so as to make a threshold voltage of said first transistor higher as compared with threshold voltages of said first control transistor and said second transistor.

2. A semiconductor storage device as claimed in claim 1, wherein said data retention circuit includes said first inverter which includes a third transistor that is connected between said first reference voltage terminal and said second node, and that has its control terminal connected to said first node, and a second inverter which includes said first transistor, and a fourth transistor that is connected between said first reference voltage terminal and said first node, and that has its control terminal connected to said second node.

3. A semiconductor storage device as claimed in claim 2, wherein the first and second transistors are transistors of a first conductivity type, and the third and fourth transistors are transistors of a second conductivity type.

4. A semiconductor storage device as claimed in claim 1, wherein said substrate potential control circuit outputs the second potential in case of reading out data stored in said first node, and outputs a third potential lower than said second potential in case of writing data into said first node.

5. A semiconductor storage device as claimed in claim 1, wherein the threshold voltage of said first transistor is, at least, about 2.7 times as high as the threshold voltage of said first control transistor.

6. A semiconductor storage device as claimed in claim 1, wherein an element size of said first transistor is substantially equal to that of said second transistor.

7. A semiconductor storage device as claimed in claim 1, wherein the threshold voltage of said first control transistor in case of writing data into said first node is substantially equal to that of said second transistor.

8. A semiconductor storage device comprising:
   a first reference voltage terminal which supplies a first potential that is a predetermined logic level;

a second reference voltage terminal which supplies a second potential that is lower than the first potential, and that is a logic level different from the predetermined logic level;

a first node;

a first control transistor which includes a first channel region connected between a bit line and said first node, and whose control terminal is connected to a word line; and a data retention circuit which includes a first transistor that includes a second channel region connected between said first node and said second reference voltage terminal, and that has its control terminal connected to a second node, and a first inverter that includes a second transistor including a third channel region connected between said second node and said second reference voltage terminal, having its input terminal and its output terminal respectively connected to said first node and to the control terminal of said first transistor, and outputting to said output terminal a voltage correspondent to the logic level different from the logic level inputted to said input terminal;

wherein an impurity concentration of the second channel region is higher as compared with impurity concentrations of the first and third channel regions.

9. A semiconductor storage device as claimed in claim 8, wherein said data retention circuit includes said first inverter which includes a third transistor that is connected between said first reference voltage terminal and said second node, and that has its control terminal connected to said first node, and a second inverter which includes said first transistor, and a fourth transistor that is connected between said first reference voltage terminal and said first node, and that has its control terminal connected to said second node.

10. A semiconductor storage device as claimed in claim 9, wherein the first and second transistors are transistors of a first conductivity type, and the third and fourth transistors are transistors of a second conductivity type.

11. A semiconductor storage device as claimed in claim 8, wherein the threshold voltage of said first transistor is, at least, about 2.7 times as high as the threshold voltage of said first control transistor.

12. A semiconductor storage device as claimed in claim 8, wherein an element size of said first transistor is substantially equal to that of said second transistor.

13. A semiconductor storage device as claimed in claim 8, wherein the threshold voltage of said first control transistor is substantially equal to that of said second transistor.

14. A semiconductor storage device comprising:

a first reference voltage terminal which supplies a first potential that is a predetermined logic level;

a second reference voltage terminal which supplies a second potential that is lower than the first potential, and that is a logic level different from the predetermined logic level;

a first node;

a first control transistor which is connected between a first bit line and said first node, and whose control terminal is connected to a word line;

a second node;

a second control transistor which is connected between a second bit line and said second node, and whose control terminal is connected to the word line;

a data retention circuit which includes a first inverter that includes a first transistor connected between said first node and said second reference voltage terminal, and having its control terminal connected to said second node, and that outputs to said first node a voltage correspondent to the logic level different from the logic level inputted to said second node, and a second inverter that includes a second transistor connected between said second node and said second reference voltage terminal, and having its control terminal connected to said first node, and that outputs to said second node a voltage correspondent to the logic level different from the logic level inputted to said first node;

wherein the threshold voltage of said first transistor in case of writing data into said first node is higher as compared with threshold voltages of said first control transistor and said second transistor.

15. A semiconductor storage device as claimed in claim 14, wherein the threshold voltage of said first transistor is, at least, about 2.7 times as high as the threshold voltage of said first control transistor.

16. A semiconductor storage device as claimed in claim 14, wherein element sizes of said first transistor and said second transistor are substantially equal to each other.

17. A semiconductor storage device as claimed in claim 14, wherein said first inverter includes said first transistor, and a third transistor which is connected between said first reference voltage terminal and said first node and whose control terminal is connected to said second node, and said second inverter includes said second transistor, and a fourth transistor which is connected between said first reference voltage terminal and said second node and whose control terminal is connected to said first node.

18. A semiconductor storage device as claimed in claim 17, wherein the first and second transistors are transistors of a first conductivity type, and the third and fourth transistors are transistors of a second conductivity type.

19. A semiconductor storage device as claimed in claim 14, wherein the threshold voltage of said first control transistor in the case of writing data into said first node is substantially equal to that of said second transistor.

20. A semiconductor storage device as claimed in claim 14, further comprising a first substrate potential control circuit which controls the threshold voltage of said first transistor in the case of writing data into said first node.

21. A semiconductor storage device as claimed in claim 20, wherein said first substrate potential control circuit outputs the second potential in case of reading out data stored in said first node, and outputs a third potential lower than said second potential in the case of writing data into said first node.

22. A semiconductor storage device as claimed in claim 20, further comprising a second substrate potential control circuit which selectively alters the substrate potential of said second transistor in case of writing data into said second node, so as to make the threshold voltage of said second transistor higher as compared with a threshold voltage of said second control transistor and said threshold voltage of said first transistor.

23. A semiconductor storage device as claimed in claim 22, wherein said second substrate potential control circuit outputs the second potential in case of reading out data stored in said second node, and outputs a third potential lower than said second potential in case of writing data into said second node.

24. A semiconductor storage device as claimed in claim 14, wherein:

said first control transistor includes a first channel region which is connected between the first bit line and said first node, said second control transistor includes a second channel region which is connected between the second bit line and said second node, said first transistor includes a third channel region which is connected between said first node and said second reference voltage terminal, and said second transistor includes a fourth channel region which is connected between said second node and said second reference voltage terminal; and an impurity concentration of the third channel region is higher as compared with impurity concentrations of the first and fourth channel regions.

25. A semiconductor storage device as claimed in claim 1, wherein the substrate potential control circuit alters the substrate potential of said first transistor in response to a write control signal for controlling writing data into said first node.

26. A semiconductor storage device as claimed in claim 1, wherein the bit line is a first bit line and writing data into the data retention circuit is performed without connection of said semiconductor storage device to a second bit line on which signals are inverse to those on the first bit line.

27. A semiconductor storage device as claimed in claim 8, wherein the bit line is a first bit line and writing data into the data retention circuit is performed without connection of said semiconductor storage device to a second bit line on which signals are inverse to those on the first bit line.

28. A semiconductor storage device as claimed in claim 14, wherein the bit line is a first bit line and writing data into the data retention circuit is performed without connection of said semiconductor storage device to a second bit line on which signals are inverse to those on the first bit line.

29. A semiconductor storage device as claimed in claim 20, wherein the substrate potential control circuit controls the substrate potential of said first transistor in response to a write control signal for controlling writing data into said first node.

30. A semiconductor storage device as claimed in claim 22, wherein the second substrate potential control circuit alters the substrate potential of said second transistor in response to a write control signal for controlling writing data into said second node.

* * * * *